United States Patent [19]

Morong, III

[11] 4,439,724
[45] Mar. 27, 1984

[54] APPARATUS FOR DETERMINING THE NUMBER OF TURNS OF A MAGNETIC COIL

[75] Inventor: William H. Morong, III, Newton, Mass.

[73] Assignee: Analog Devices, Incorporated, Norwood, Mass.

[21] Appl. No.: 211,235

[22] Filed: Nov. 28, 1980

[51] Int. Cl.³ .................. G01R 31/02; G01R 31/06
[52] U.S. Cl. .............................................. 324/55
[58] Field of Search ................................ 324/55, 59

[56] References Cited

U.S. PATENT DOCUMENTS 3,953,791  4/1976  Spurr et al. ................... 324/55 X

FOREIGN PATENT DOCUMENTS 2019015A  10/1979  United Kingdom ............... 324/55

*Primary Examiner*—Stanley T. Krawczewicz
*Attorney, Agent, or Firm*—Parmelee, Bollinger & Bramblett

[57] ABSTRACT

Apparatus for determining the number of turns of a test coil wound on a magnetic core comprising a reference coil with a pre-fixed number of turns wound on a reference core and coupled to a resistive load. The test coil is linked to the reference coil by a single-turn primary supplied with a-c current of substantially constant amplitude. An adjustable resistive load is connected across the test coil. Both load resistors are of low ohmic value, to operate the two coils as heavily-burdened current transformers. The coil voltages are compared by a phase-sensed comparator, and the adjustable resistor is set to produce a null comparison condition. At this condition, the number of turns of the test coil will be proportional to the resistance of the adjustable resistor, and this number is indicated by a calibrated digital readout device.

7 Claims, 2 Drawing Figures

APPARATUS FOR DETERMINING THE NUMBER OF TURNS OF A MAGNETIC COIL

BACKGROUND OF THE INVENTION

This invention relates to electronic test equipment for determining the number of turns of a coil wound on a magnetic core. More particularly, this invention relates to such apparatus for checking the number of coil turns quickly and accurately, and which is operable by relatively unskilled personnel.

Manufacture of transformers and related wound-coil elements commonly requires close control over the number of turns on the core. Coils are wound both manually and by machine, but in either procedure it is not readily possible to be precisely certain that the exact number of turns specified has been wound. This becomes a problem not only for the manufacturer of the coil or transformer, but also for the purchaser of the device, especially for applications where the number of turns must be exactly as specified or else the apparatus incorporating the coil will be rejected. Thus it is important to be able to perform a test on the completed device to determine the exact number of turns, so that if the number is not in accordance with the specifications, the winding can be augmented or reduced to reach the required number of turns. In additiion, it often is desirable to have means for continuously monitoring the number of turns applied as the winding operation proceeds, in order to be able to stop the operation when the specified number has been reached.

Various different kinds of apparatus have been proposed and used heretofore for determining the number of turns on a wound core. Such prior apparatus generally has not been satisfactory. For example, simple devices to measure the output voltage for a given excitation of the core suffered from inacuracies resulting from the effects of changeable resistances (contact resistances, etc.) in series with the excitation circuit. In an effort to solve such problems, one prior coil turns checker required that two separate, relatively heavy rigid bars be passed through the core being tested. Such arrangement is unsatisfactory for several reasons, including the fact that it is not suited for making measurements of the very small-sized coils used in many modern electronic components.

SUMMARY OF THE INVENTION

In a preferred embodiment of the invention to be described hereinbelow in detail, a coils turns checker is provided which avoids the above-described disadvantages of prior art devices. In accordance with an important aspect of the invention, a reference wound-core coil of known characteristics is coupled to the wound-core coil to be tested by means of a single-turn primary winding passing through both cores. A substantially constant a-c current is caused to flow through this primary winding to excite both wound coils as secondary windings of respective transformers. These secondary windings are heavily burdened by respective low-resistance loads. The load on the reference coil is of fixed value, and that on the coil under test is of controllable ohmic resistance.

The a-c voltages on the reference and test coils are directed to a comparator which produces a d-c output signal having a polarity and magnitude determined by the difference between the two a-c voltages being compared. The controllable resistive load connected across the coil under test is altered until the comparator output reaches a null. The value of the adjustable resistive load under such condition is a precise measure of the number of turns on the coil under test; the number of turns may for example be indicated by a read-out device coupled mechanically to the control element of the adjustable resistor and calibrated to present the number in digital format.

Accordingly, it is an object of the present invention to provide a coil turns checker which is simple in design, economical to manufacture, accurate in performance, and easy to operate. Other objects, aspects and advantages of the invention will in part be pointed out in, and in part apparent from, the following description of a preferred embodiment of the invention, considered together with the accompanying drawings.

DESCRIPTION OF A PREFERRED EMBODIMENT

Figure 1:
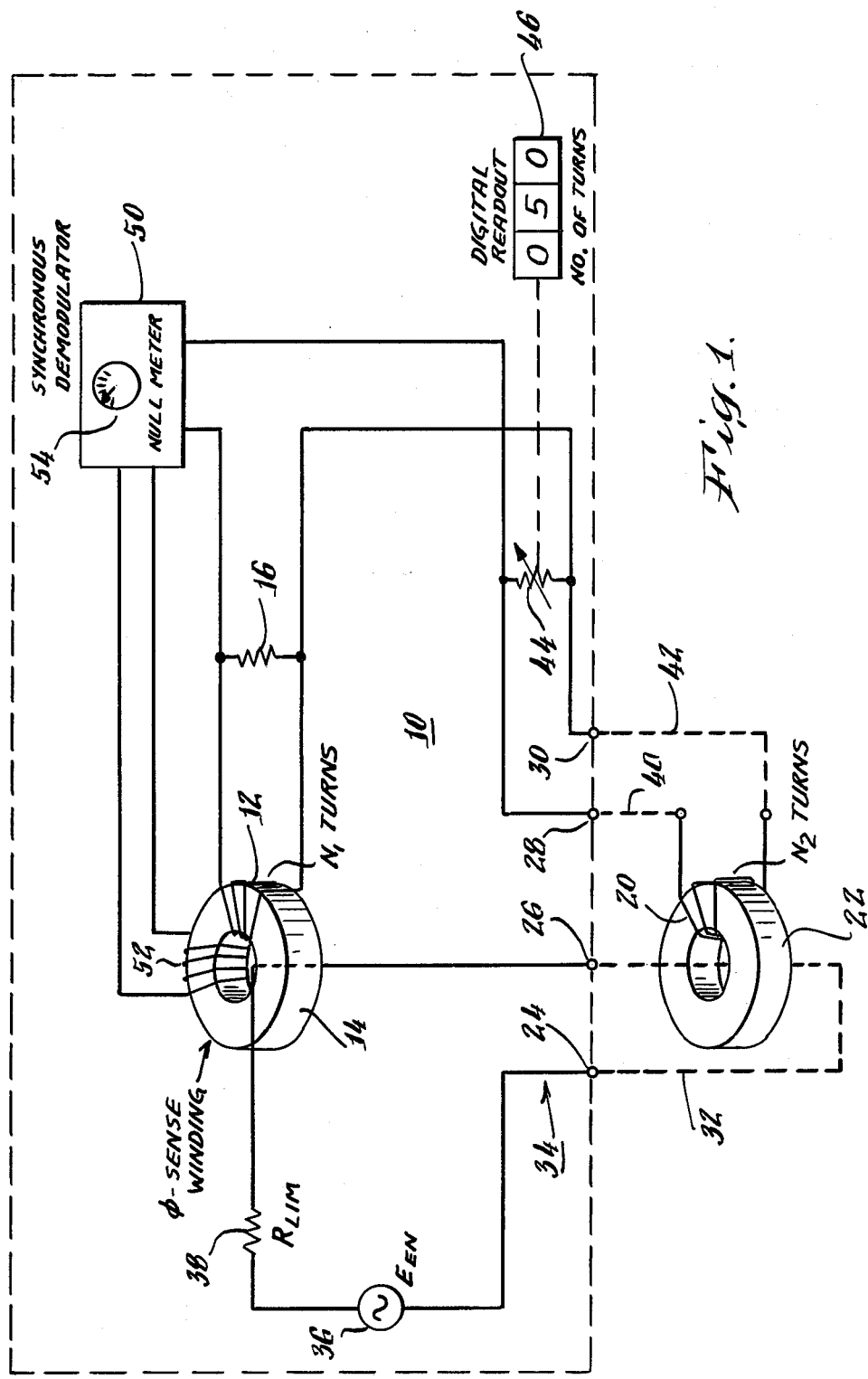
FIG. 1 is a simplified schmatic diagram, partly in block form, illustrating the principles of the invention.

Referring first to FIG. 1, a coil turns checking instrument 10 in accordance with this invention includes a reference coil 12 wound on a core 14 with a predetermined number of turns, and having a low-resistance load resistor 16 connected directly thereacross. For example, the coil 12 may have 50 turns, and the resistor 16 may have a resistance of 50 ohms. The coil 20 to be tested, wound on a core 22 like core 14, is coupled to the instrument 10 through four terminals 24–30.

In more detail, a lead 32 is passed through the core 22 and connected to the left-hand terminals 24, 26 to complete a single-turn primary winding 34 linking both cores 14 and 22. This primary winding is energized by an a-c voltage source 36 to produce a substantially constant primary current limited in magnitude by a series resistor 38.

The ends of the coil 20 are connected by leads 40, 42 to the right-hand terminals 28, 30 across which is connected an adjustable load resistor 44. The adjustable element of this resistor is mechanically linked to a digital read-out device 46 to indicate the number of turns on the core 22, as will be explained hereinafter. This load resistor 44, like load resistor 16, has a relatively low ohmic resistance, e.g. one ohm per turn of the coil 20.

The voltages developed across the load resistors 16 and 44 by the current in primary winding 34 are connected by respective leads to an a-c phase-sensed comparator 50 serving as a synchronous demodulator. This comparator is supplied with an a-c phase-sense signal from a winding 52 wound on the reference core 14. The output of the comparator is a d-c signal having a polarity and magnitude determined by the relative magnitudes of the a-c secondary signals from the coils 12 and 20. When these secondary signals are equal, the d-c output will be zero, indicated by a null on an output meter 54.

With both coils 12 and 20 operated as heavily-burdened current transformers, the ratio of the primary to the secondary current in each will be directly proportional to the respective turns-ratio. That is, in general:

$$Ip = Ns/Np \cdot Is = Ns/Np \cdot Es/Rs \quad (1)$$

where:
Ip is the primary current
Is is the secondary current
Ns is the number of secondary turns
Np is the number of primary turns
Es is the secondary voltage
Rs is the load resistance on the secondary winding
(Note: The input impedance of comparator 50 is effectively infinite.)
Since each transformer receives the identical primary current, it will be clear from equation (1) above that when the output meter 54 indicates a null, with both secondary voltages equal, the following relationship will have been established:

$$N_{s1}/R_{s1} = N_{s2}/R_{s2} \quad (2)$$

where the subscript 1 indicates the reference coil 12 and the subscript 2 indicates the coil 20 under test.
Accordingly, the number of turns on the coil under test will be given by:

$$N_{s2} = N_{s1} \cdot R_{s2}/R_{s1} = K \cdot R_{s2} \quad (3)$$

where K is a known constant, and $R_{s2}$ is the ohmic value of the adjustable resistor 44.

The number of turns determined in this fashion is indicated by the read-out device 46 which is linked to the adjusting element of the resistor 44, and calibrated to read the number of turns directly in digital format.

By operating the coils 12 and 20 as heavily burdened current transformers, errors due to possible changes in inductance (such as might be caused by variations in core magnetic properties) are substantially minimized, since the reactive component of current (reflected to the primary) will be very small relative to the real component. To this end, the ohmic resistance of the load should be smaller than the reactive impedance of the coil by at least an order of magnitude; preferably the load resistance should be approximately 1/100 of the reactive coil impedance. Further precision of measurement is provided by the use of the phase-sensed comparator 50 since it responds only to the real (in-phase) component of the signal, and not to the quadrature component.

An important advantage of the disclosed instrument is that variations in resistance in series with the primary winding, e.g. contact resistances, do not significantly affect the measurement. Moreover, the instrument can be operated with only a single-turn primary, thus providing simplicity in construction and operation. Although in the described embodiment the adjustable resistor 44 is controlled manually to reach null output, it will be understood that this adjustment can be made automatically, as by means of known feedback control devices responsive to the output of the comparator.

Figure 2:
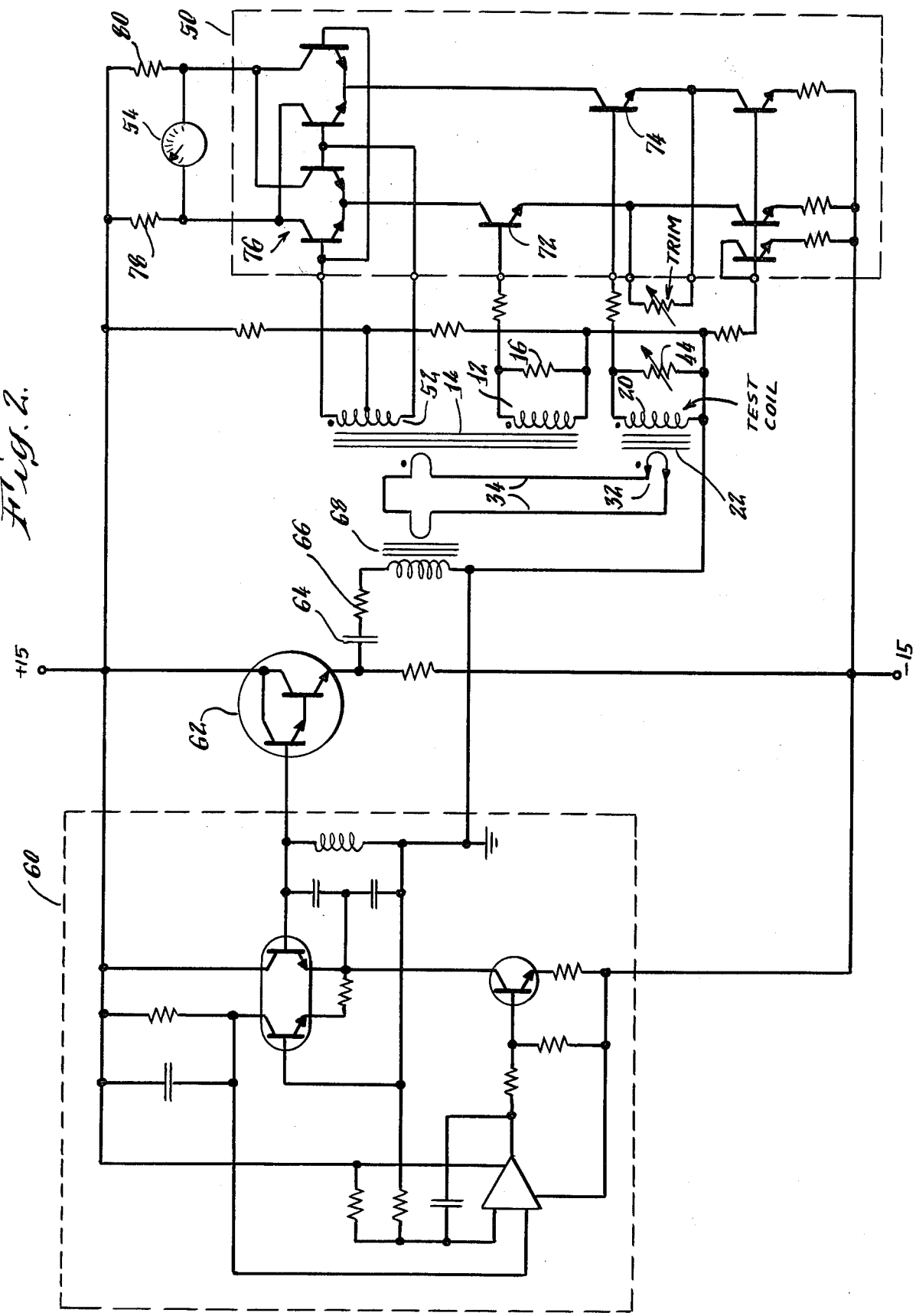
FIG. 2 is a circuit diagram showing the details of a preferred commercial embodiment of the invention.

FIG. 2 shows the detailed design of a presently preferred embodiment of the invention. In this unit, the supply voltage for developing the primary winding current comprises an oscillator 60 generally of conventional character. The output of this oscillator is directed to an emitter follower circuit 62 which supplies current through a capacitor 64 and resistor 66 to a transformer 68. The secondary 70 of this transformer energizes the single-turn primary 34 linking the reference core 14 and the test core 22. The corresponding coil windings 12 and 20 are coupled to respective transistors 72, 74 in the comparator 50. The phase-sense winding 52 on core 14 is coupled to a four-transistor phase-sensed rectifier circuit 76 which develops d-c current output signals through resistors 78, 80. Any unbalance of these signals is detected by the null meter 54 which functions as described above with reference to FIG. 1.

Although a preferred embodiment of this invention has been described hereinabove in detail, it is desired to emphasize that this has been for the purpose of illustrating the invention and should not be considered as necessarily limitative of the invention, it being understood that many modifications can be made by those skilled in the art while still practicing the invention claimed herein.

I claim:

1. An instrument for determining the number of turns of a test coil wound on a magnetic core, comprising:
   a reference core;
   a reference coil wound on said reference core with a predetermined number of turns;
   a first load coupled across said reference coil;
   a second load of adjustable magnitude to be connected across the test coil;
   means to couple the test coil to said instrument;
   said coupling means comprising first means to connect primary winding means linking both of said cores in common;
   said coupling means further including second means to connect the voltage on said test coil to said adjustable load;
   means for supplying a-c current to said primary winding means;
   the magnitudes of said first and second loads being set at values to operate both of said coils as heavily-burdened current transformers;
   comparator means for comparing the a-c signals developed by said two coils; and
   means for producing a measurement output corresponding to the value of said adjustable load when it has been set to produce a null between said a-c signals of said two coils.

2. An instrument as in claim 1, wherein said first and second loads are resistors.

3. An instrument as in claim 1, wherein said primary winding means is a single-turn winding.

4. An instrument as in claim 1, wherein said comparator means comprises a phase-sensed comparator.

5. An instrument as in claim 4, wherein said comparator is activated by a phase-sense signal developed by a winding on said reference core.

6. An instrument as in claim 1, wherein said means for producing a measurement output comprises a read-out device presenting the number of turns in digital format.

7. An instrument for determining the number of turns of a test coil wound on a magnetic core, comprising:
   a reference core;
   a reference coil wound on said reference core with a predetermined number of turns;
   a first load coupled across said reference coil;
   a second load of adjustable magnitude to be connected across the test coil;
   means to couple the test coil to said instrument;
   said coupling means comprising first means to connect a single-turn primary winding linking both of said cores in common;

said coupling means further including second means to connect the voltage on said test coil to said adjustable load;

means for supplying a-c current to said primary winding means;

comparator means for comparing the a-c signals developed by said two coils; and means for producing a measurement output corresponding to the value of said adjustable load when it has been set to produce a null between said a-c signals of said two coils.

* * * * *